(12) United States Patent
Yang et al.

(10) Patent No.: US 10,076,904 B2
(45) Date of Patent: *Sep. 18, 2018

(54) INTEGRATED CIRCUIT DEVICES COMPRISING MEMRISTORS

(71) Applicant: HEWLETT-PACKARD DEVELOPMENT COMPANY, L.P., Houston, TX (US)

(72) Inventors: Jianhua Yang, Palo Alto, CA (US); Ning Ge, Palo Alto, CA (US); Zhiyong Li, Foster City, CA (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/637,272

(22) Filed: Jun. 29, 2017

(65) Prior Publication Data

US 2017/0305153 A1 Oct. 26, 2017

Related U.S. Application Data

(63) Continuation of application No. 15/032,551, filed as application No. PCT/US2013/067872 on Oct. 31, 2013, now Pat. No. 9,701,115.

(51) Int. Cl.
*B41J 2/14* (2006.01)
*B41J 2/16* (2006.01)
*B41J 2/045* (2006.01)

(52) U.S. Cl.
CPC ........ *B41J 2/14072* (2013.01); *B41J 2/0458* (2013.01); *B41J 2/04541* (2013.01);
(Continued)

(58) Field of Classification Search
CPC . B41J 2/14016; B41J 2/14072; B41J 2/14129
See application file for complete search history.

(56) References Cited

U.S. PATENT DOCUMENTS

| 3,500,142 A | 3/1970 | Kahng |
| 4,876,668 A | 10/1989 | Thakoor et al. |

(Continued)

FOREIGN PATENT DOCUMENTS

| CN | 1260593 | 7/2000 |
| CN | 1282665 | 2/2001 |

(Continued)

OTHER PUBLICATIONS

Korean Intellectual Property Office, International Search Report and Written Opinion for PCT/US2013/067872 dated Jul. 21, 2014 (13 pages).

(Continued)

*Primary Examiner* — Geoffrey Mruk
(74) *Attorney, Agent, or Firm* — HP Inc. Patent Department

(57) ABSTRACT

In some examples, an integrated circuit device includes a substrate, a memristor over the substrate and comprising a first metal layer as a first electrode, a second metal layer as a second electrode, and a switching oxide layer between the first and second metal layers, and a thermal resistor layer over the substrate.

18 Claims, 8 Drawing Sheets

(52) U.S. Cl.
CPC ......... *B41J 2/14016* (2013.01); *B41J 2/1601* (2013.01); *B41J 2/1626* (2013.01)

(56) References Cited

U.S. PATENT DOCUMENTS

| | | |
|---|---|---|
| 7,365,387 B2 | 4/2008 | Benjamin |
| 7,375,997 B2 | 5/2008 | Rice et al. |
| 7,543,906 B2 | 6/2009 | Benjamin et al. |
| 9,701,115 B2 * | 7/2017 | Yang .................... B41J 2/14072 |
| 2002/0126301 A1 | 9/2002 | Bowers |
| 2003/0002899 A1 | 1/2003 | Furukawa et al. |
| 2005/0099458 A1 | 5/2005 | Edelen et al. |
| 2006/0055745 A1 | 3/2006 | Yagi |
| 2006/0238576 A1 * | 10/2006 | Lee ........................ B41J 2/1412 |
| | | 347/64 |
| 2007/0242110 A1 | 10/2007 | Bruce et al. |
| 2008/0048520 A1 | 2/2008 | Gulvin et al. |
| 2011/0038196 A1 | 2/2011 | Tour et al. |
| 2012/0317662 A1 | 12/2012 | Neo et al. |
| 2013/0106930 A1 * | 5/2013 | Lea ........................ B41J 2/1753 |
| | | 347/9 |
| 2013/0155766 A1 | 6/2013 | Liu |

FOREIGN PATENT DOCUMENTS

| | | |
|---|---|---|
| CN | 1547757 | 11/2004 |
| TW | 200807689 A | 2/2008 |
| TW | 201240021 A | 10/2012 |

OTHER PUBLICATIONS

Mouttet, B., Proposals for Memristor Crossbar Design and Applications, Nov. 21, 2008 (59 pages).

\* cited by examiner

INTEGRATED CIRCUIT DEVICES COMPRISING MEMRISTORS

CROSS REFERENCE TO RELATED APPLICATIONS

This is a continuation of U.S. application Ser. No. 15/032,551, having a national entry date of Apr. 27, 2016, which is a national stage application under 35 U.S.C. § 371 of PCT/US2013/067872, filed Oct. 31, 2013, which are both hereby incorporated by reference in their entirety.

BACKGROUND

Some printers have printheads that dispense ink on a substrate such as paper.

Figure 1A:
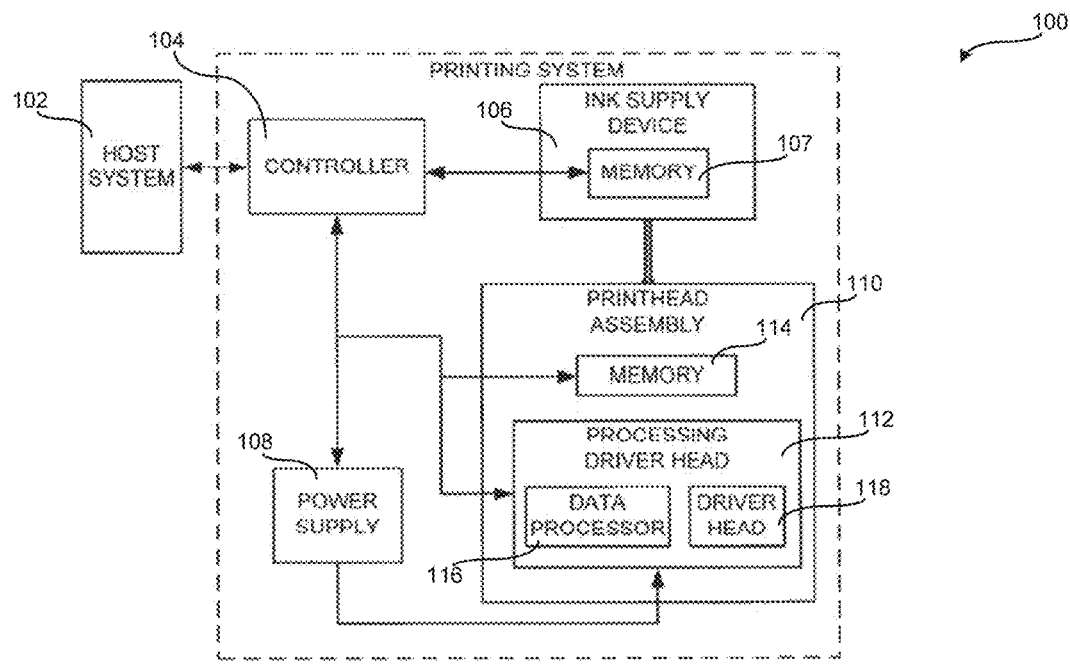
FIG. 1A is a schematic illustration of an example printing apparatus implemented in accordance with the teachings of this disclosure.

The figures are not to scale. Wherever possible, the same reference numbers will be used throughout the drawing(s) and accompanying written description to refer to the same or like parts. As used herein, stating that a layer is "on", "above" or "below" another layer does not mean the two layers must be in "contact"; they may be in direct contact and intervening layers may or a may not be present. The phrase "in contact with" is used to mean direct contact between two structures without an intervening structure or layer.

DETAILED DESCRIPTION

Examples disclosed herein relate to printheads (e.g., disposable integrated printheads (IPH), permanent printheads with off-axis ink supplies), printers and/or imaging devices (e.g., printers, copiers, etc.) that include memories (e.g., non-volatile memories, memristor memories (e.g., memristors having 1 k-5 k memristor bits, memristors having greater than 5 k memristor bits, etc.), etc.). Some example devices disclosed herein support implementing anti-counterfeiting (AFC) technologies and/or secure authentication information in printheads. Examples disclosed herein are useful to reduce production costs (e.g., reducing per-bit-cost) related to manufacturing printheads while improving printing performance and incorporating additional features (e.g., security features) into such printheads. Additionally or alternatively, example printheads disclosed herein are configured to store data associated with identification information, authentication information, cloud-based printing, market data, information, customer-appreciated value (CAV) functions, data, etc.

In some examples, a memory (e.g., a memristor, a resistive random-access memory) is integrally formed within or on a printhead using surfaces and/or structures (e.g., metal layers) of the printhead. Thus, a portion of the memristor itself is one or more layer(s) of an otherwise functional printhead. Examples disclosed herein may be produced using a NMOS process, a CMOS process, a BiCMOS, a Bipolar-CMOS-DMOS (BDCD) process or any other process of making printheads and/or semiconductors. Examples disclosed herein may be used to manufacture an integrated circuit (IC) chip (e.g., 2.5 mm×2.5 mm size chips, 5×5 mm size chips, etc.) or an IC die on a printhead using an anion-based bipolar memristor based on a metal oxide system. In such examples, metal oxide is deposited (e.g., sputtered, deposited using atomic layer deposition (ALD), physically deposited) on the printhead to form a memristor structure. Alternatively, a metal layer of the printhead is oxidized to form the memristor structure.

In some examples, a memristor is built on, formed on, fabricated on and/or integral to a printhead using a metal-oxide-metal structure (e.g., a metal-insulator-metal). Examples disclosed herein provide feasible, cost-effective and highly manufacturable structures to form a printhead on a silicon area of suitable size (e.g., a relatively small area comparable to the space available on the printhead) to implement a bank of memory bits to store identification (ID) information and provide authentication. In some examples, the example memristor that is formed on and/or formed integral to the printhead is provided with an ID bits line or ID line to store identification information for authentication purposes. Examples disclosed herein use the ID line to store identification for authentication purposes. Examples disclosed herein use the ID line to receive and store security or authentication data. Such security or authentication data may be used to identify a corresponding printhead (or print cartridge) as an authentic product from a specific manufacture (e.g., an authentic HP print cartridge). In this manner, the ID line is useful for manufactures to distribute parts that are verifiable as authentic manufacturer parts. Such verifiable authenticity of parts aids in efforts to combat counterfeiting of after-market parts that are often of poorer quality and can sometimes damage machines or decrease performance of machines in which the counterfeit parts are installed. In some examples, the ID line may additionally or alternatively store encryption/decryption data (e.g., security keys) for use in secure printing that involves, just prior to printing, decrypting data sent to a printer in an encrypted format.

In the illustrated examples, a shift register or other addressing structure is connected to bit cells of a memristor array and to the ID line for memory bit addressing and/or other addressing method(s) (e.g., byte addressing, word addressing, etc.). In some examples, the ID line is coupled and/or connected to an external analog application-specific integrated circuit (ASIC) hosted in a printer having an electrical current source and an analog-to-digital converter (ADC) that measures resistance. In some examples in which the disclosed examples are implemented using a permanent printhead, there is on-chip DAC abilities and, thus, no dedicated ID line may be included. In some examples, the ASIC programs information (e.g., 512 bits, 1024 bits, etc.) into bits of the ID line by switching the memristor from an initial high-resistance state (HRS) to a low-resistance state (LRS) by applying a suitable switching voltage. In some examples, the examples disclosed herein advantageously include memristor memories that, for example, are programmable one time. In some examples, the example memristor memories have relative low requirement for retention (e.g., >1.5-3 years). In some examples, the example memristor memories have two memory states (e.g., "1" and "0" with a resistance difference). In some examples, the example memristor memories have a relatively low resolution requirement for off-to-on programing ratio (e.g., >2:1). In some examples, the example memristor memories have a bit size of less than 1-2 k bits, are micron-size devices (e.g., 1-4 um, 2.5 um, 4 um). In some examples, the example memristor memories have a relatively low performance requirement for switching speed (e.g., microseconds (ms)). In some examples, the example memristor memories have flexible current (e.g., <1.5 Amps), power and voltage (e.g., <15.5V) requirements and/or have a relatively flexible architecture (e.g., a one diode per memristor (1D1M) architecture, a one transistor per memristor (1T1M) architecture).

FIG. 1A shows an example block diagram of a printing and/or imaging apparatus 100 in which examples disclosed herein can be implemented. While FIG. 1A depicts the printing apparatus 100 as implemented with a permanent printhead, in other examples, the printing apparatus 100 and any of the examples disclosed herein can be equality implemented with a printing apparatus having an integrated printhead (e.g., a disposable cartridge).

As shown in FIG. 1A, in some examples, the printing apparatus 100 is coupled and/or otherwise in communication with a host system 102 such as a computer and/or microprocessor. In the illustrated example, the printing apparatus 100 includes a controller 104, an ink supply device 106 having a memory 107, a power supply 108 and an integrated printhead assembly 110. In some examples, the printhead assembly 110 is integrally coupled to the printing apparatus 100. In examples in which the printhead assembly 110 is, for example, a disposable printer cartridge, the printhead assembly 110 is removably coupled to the printing apparatus 100.

In the example of FIG. 1A, the ink supply device 106 is fluidly coupled to the printhead assembly 110 to enable ink to be selectively provided to the printhead assembly 110. In some examples, the printhead assembly 110 includes a processing driver head 112 and a memory (e.g., on-chip memory) 114. The example processing driver head 112 includes a processor 116 and a driver head 118. In the illustrated example, the memory 114 includes an ID bit line or ID line 120 to store authentication/security data. However, in examples in which the printing apparatus 100 is implemented with an integrated printhead and/or a permanent printhead using TIJ4 and having on-chip DAC capabilities, an ID line 120 may not be present. In examples disclosed herein, the memory 114 is implemented using a memristor integrally formed in or on the printhead assembly 110.

In operation, the example power supply 108 provides power to the controller 104, the printhead assembly 110 and/or the processing driver head 112. In addition, the controller 104 receives data from the host system 102. For example, the data may be authentication/security data to be stored in the ID line 120 or the data may be print data. In some examples, the controller 104 processes the data into printer control information and/or image data that is provided to the ink supply device 106 and/or the printhead assembly 110 to efficiently control the printing apparatus 100. Additionally or alternatively, during an initial programming phase, the controller 104 stores received authentication/security data into the ID line 120 as part of a one-time programing (OTP) process. In such examples, the authentication/security data is useful for ACF features to, for example, confirm that an ink cartridge including the printhead assembly 110 is an authentic part. Additionally or alternatively, the authentication/security data may be used to implement secure printing based on data received at the printing system in an encrypted format.

The memory 107 and the memory 114 may be used to store any type of data. In some examples, the memory 107 stores ink supply specific data and/or ink identification data, ink characterization data, ink usage data, etc. In some examples, the memory 114 stores printhead specific data and/or printhead identification data, warranty data, printhead characterization data, printhead usage data, authentication data, anti-counterfeiting data (ACF), etc. The memory 107 and/or the memory 114 can be written to at the time of manufacturing and/or during the operation of the printing apparatus 100.

Figure 1B:
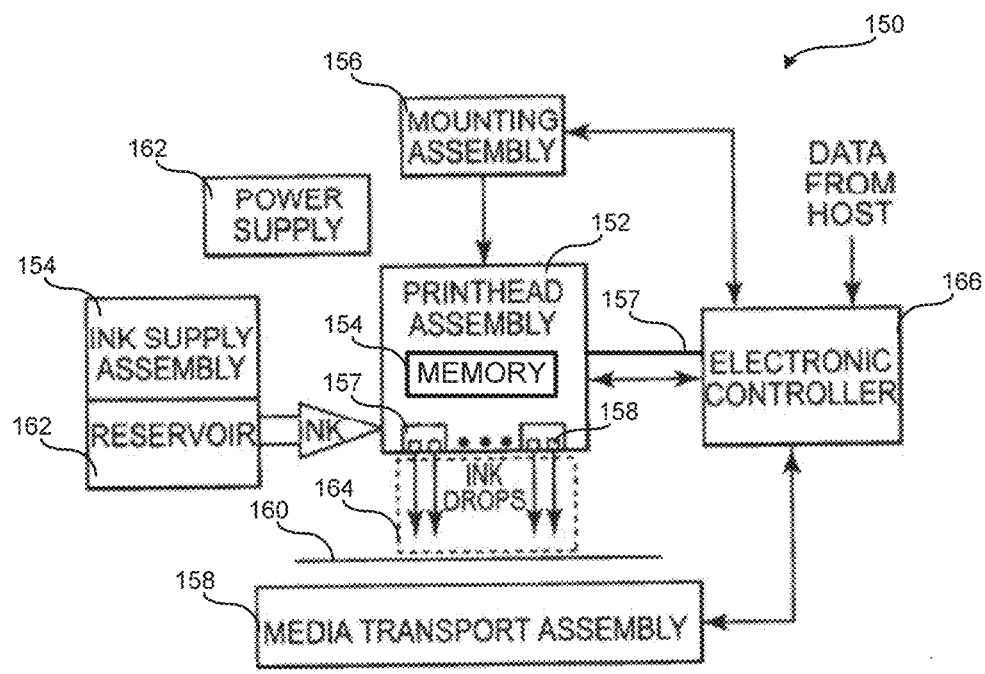
FIG. 1B is a schematic illustration of an example printing apparatus implemented in accordance with the teachings of this disclosure.

FIG. 1B shows an example inkjet priming system 150 that includes an example inkjet printhead assembly 152 and an example ink supply assembly 154. In the illustrated example, the inkjet printing system 150 includes a mounting assembly 156, a media transport assembly 158, an electronic controller 160 and power supply 162 that provides power to the various electrical components of inkjet printing system 150.

In the illustrated example, the inkjet printhead assembly 152 includes a memory (e.g., on-chip memory) 154, one or more printhead die(s) 157 and one or more nozzle(s) 158. In the illustrated example, the memory 154 and an ID line 157 are communicatively coupled to the electronics controller 160.

In some examples, the printhead die (e.g., printhead) 157 ejects drops of ink through the nozzle 158 toward a print medium 160 so as to print onto print medium 160. In some examples, the printhead 157 is a fluid ejection device and the print media 160 is any suitable sheet material such as, for example, paper, card stock, transparencies, Mylar, fabric, etc. In some examples, the nozzles 158 are one or more columns and/or arrays that eject ink from the nozzles to produce characters, symbols, graphics, images, etc., on the print medium 160 as the inkjet printhead assembly 152 and the print medium 160 are moved relative to one another. The printhead assembly 150 may be used to eject ink, liquids, fluids, flowable materials (e.g., clear fluid), etc.

In the illustrated example, the ink supply assembly 154 includes a reservoir 162 for storing ink that is to be provided to the printhead assembly 152. In some examples, the ink supply assembly 154 is a one-way ink delivery system that provides ink to the inkjet printhead assembly 152 is consumed during printed. In other examples, the ink supply assembly 154 is a recirculating ink delivery system in that a portion of the ink provided to the printhead assembly 152 that is consumed during printing and another portion of the ink provided to the printhead assembly 152 is returned to the reservoir 162 and/or the ink supply assembly 154.

In some examples, the inkjet printhead assembly 152 and the ink supply assembly 154 are housed together in an inkjet cartridge or pen. In other examples, the ink supply assembly 154 is separate from the inkjet printhead assembly 154 and provides ink to the inkjet printhead assembly 152 via a coupling and/or an interface connection (e.g., a supply tube). In the illustrated example, the reservoir 162 may be removed, replaced and/or refilled. In examples in which the inkjet printhead assembly 152 and the ink supply assembly 154 are housed together in an inkjet cartridge, the reservoir 162 may include a local reservoir located within the cartridge and/or a larger reservoir located outside of the cartridge. In some such examples, the larger reservoir, which may be removed, replaced and/or refilled, is fluidly coupled to and refills the ink supply of the smaller local reservoir.

In the illustrated example, the mounting assembly 156 positions the inkjet printhead assembly 152 relative to the media transport assembly 158 and the media transport assembly 158 positions the printhead medium 160 relative to the inkjet printhead assembly 152. Thus, in the illustrated example, a print zone 164 is defined adjacent the nozzles 158 between the inkjet printhead assembly 152 and the print medium 160.

In some examples, the inkjet printhead assembly 152 is a scanning type printhead assembly. In some such examples, the mounting assembly 156 includes a carriage that moves the inkjet printhead assembly 156 relative to the media 160 to enable scanning thereof. In other examples, the inkjet printhead assembly 152 is anon-scanning type printhead assembly. In some such examples, the mounting assembly 156 fixes the inkjet printhead assembly 152 relative to the media transport assembly 158 and the media transport assembly 158 positions and/or moves the print medium 160 relative to the inkjet printhead assembly 152.

In some examples, the electronic controller (e.g., printer controller) 160 includes a processor, firmware, etc. to communicate with and/or control the inkjet printhead assembly 152, the mounting assembly 156 and the media transport assembly 158. In the illustrated example, the electronic controller 160 receives data 166 from a host system and the data 166 is then sent to the inkjet printing system 150 along with electronic information, infrared information, optical information, information transfer path information, etc. In some examples, the data 166 is associated with a document and/or file to be printed and/or print job commands and/or command parameters.

Figure 2:
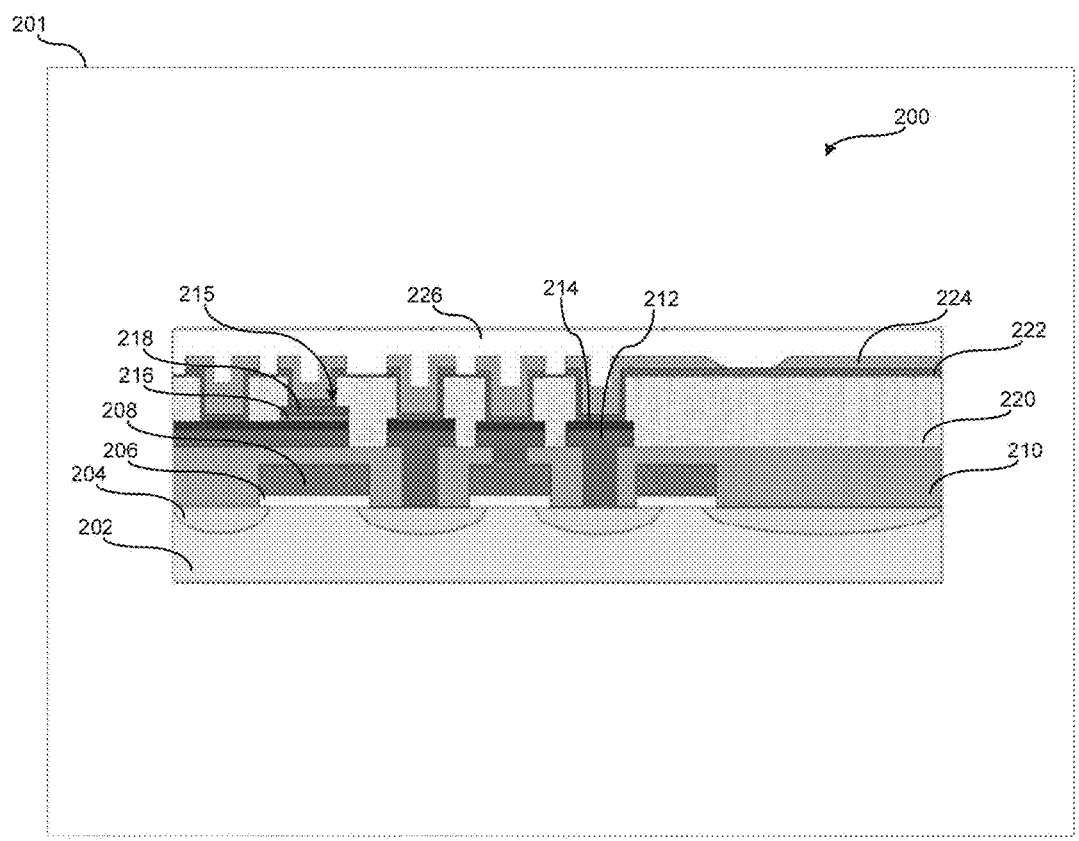
FIG. 2 is an example integrated circuit that can be used to implement the example printing apparatus of FIG. 1A and/or FIG. 1B.

FIG. 2 shows an example integrated circuit 200 that can be used to implement the printhead assembly 110 and/or the memory 114 of FIGS. 1A and 1B. The example illustrated in FIG. 2 can be implemented with NMOS based on a front end of line process (FEOL) or any other suitable process such as CMOS, BICMOS, BCD, etc. In the illustrated example, the integrated circuit 200 is incorporated into a printhead body (e.g., printhead silicon) 201 and includes a substrate layer (e.g., a first layer, P-type silicon substrate, N-type silicon substrate) 202 including doped regions 204 (e.g., N+ doping to decrease resistivity), a gate oxide layer (e.g., a second layer) 206 and a polysilicon layer (e.g., a third layer) 208. In the illustrated example, the gate oxide layer 206 is between the substrate layer 202 and the polysilicon layer 208. Additionally, in the illustrated example, the integrated circuit 200 includes an interlayer dielectric (ILD) layer (e.g., a fourth layer) 210 and metal layers (e.g., fifth and sixth layers) 212, 214. In the illustrated example, some portions of the ILD layer 210 are in contact with the substrate layer 202, some portions of the metal layer 212 are in contact with the substrate layer 202, other portions of the metal layer 212 are in contact with the ILD layer 210 and the metal layer 214 is in contact with the metal layer 212. In some examples, the ILD layer 210 includes borophosphosilicate glass (BPSG) and/or undoped silicate glass (USG) and may be used as a metal-oxide-semiconductor field-effect transistor (MOSFET) for logic and/or PowerFET for the integrated circuit 200. In some examples, the metal layer 212 includes a metal such as an aluminum-copper alloy (AlCu or AlCuSi), and the metal layer 214 includes TiN, TaN, NbN, HfN, ZrN, RuO2, IrO2, Al, Ta, Ti, Cu, Co, Ni, Nb, Mo, W, Hf, Zr, Cr or any other suitable metal. In some such examples, the layers including the substrate 202 through the metal layer 212 and/or the metal layer 214 are part of and/or are integral to the printhead assembly 110 and one or both of the metal layers 212, 214 forms a bottom electrode for a memristor 215. For example, the structure of the substrate layer 202 through the metal layer 214, and specifically including the bottom electrode layer 214, may be integral structures and/or layers of a printhead used for printing functionality. In some instances, examples disclosed herein may be used to advantageously form a memristor on the metal layer 212 and/or the metal layer 214 of the printhead.

In the illustrated example, the integrated circuit 200 includes a memristor switching oxide layer (e.g., a seventh layer) 216 and a metal layer (e.g., an eighth layer, a memristor top electrode layer) 218. The example memristor 215 is formed using the metal layer 214 that may be a bottom electrode of the memristor 215, the memristor switching oxide layer 216 (e.g., a memristor cross-bar structure) and the metal layer 218 that may be used as the top electrode of the memristor 215. In some examples, the memristor switching oxide layer 216 is formed by oxidizing one or more of the metal layers 212, 214 and/or by depositing and/or sputtering an oxide or nitride layer (e.g., $HfO_x$, $TaO_x$ (0<x<2.5), $ZrO_x$ (0<x<2), $ZnO_x$ (0<x<2), $NiO_x$ 0<x<1.5), $FeO_x$ (0<x<1.5), $CoO_x$ (0<x<1.5), $YO_x$ (0<x<1.5), $SiO_x$ (0<x<2), $WO_x$ (0<x<3), $NbO_x$ (0<x<2.5), $TiO_x$ (0<x<2), $AlO_x$ (0<x<1.5), $MoO_x$ (0<x<3), $GaO_x$ (0<x<1.5), $AlN_x$ (0<x<1.5), $GaN_x$ (0<x<1.5), $AlGaN_x$ (0<x<1.5), etc. where x is greater than 0 and less that (or up to) the stoichiometric amount) thereon. Additionally, in this example, the integrated circuit 200 includes a dielectric layer (e.g., a ninth layer) 220, a metal layer (e.g., a tenth layer) 222, a thermal inkjet resistor layer (e.g., an eleventh layer and/or metal layer) 224 and/or a passivation layer (e.g., a twelfth layer) 226. In some examples, the thermal inkjet resistor layer 224 includes tantalum aluminum (TaAl), $TaAlO_x$, WSiN, TaSiN and/or an aluminum-copper alloy.

For ease of description, the nomenclature of first, second, third, etc. are used to facilitate in distinguishing between the layers 202, 204, 206, etc. of the integrated circuit 200. However, such first, second, third, etc. naming convention is not intended to signify any priority, importance or inherent physical positioning of the layers relative to one another. That is, first, second, third, etc. terms may be arbitrarily applied to any layer to ease in identifying between different layers.

FIGS. 3-14 depict an example process of producing the example integrated circuit 200 of FIG. 2. In some examples, the process described below of incorporating the integration of memristor memories into the on-chip printhead occurs when fabricating the integrated circuit 200 of FIG. 2. While FIGS. 3-14 depict a particular number of layers being formed and particular layer(s) being formed in a particular order, the order in which any one or more of the layers are formed may be changed and/or the number of layers formed may be changed (e.g., increased, decreased, etc.).

Figure 3:
FIGS. 3-15 show example structures fabricated during a process of producing the example integrated circuit of FIG. 2.
Figure 4:
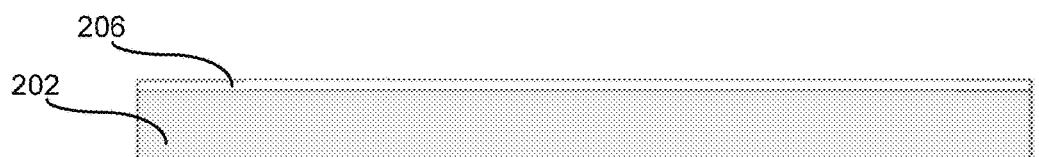
Figure 5:
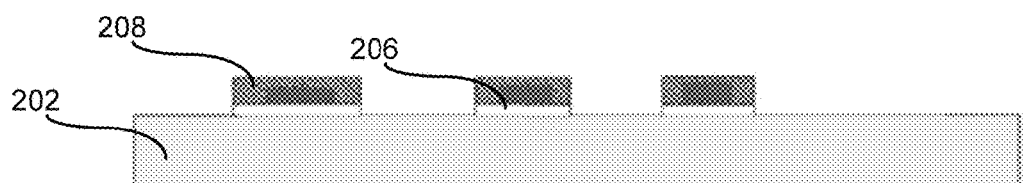

As shown in the illustrated examples of FIGS. 3, 4, and 5, the process begins with the gate oxide layer 206 and the polysilicon layer 208 being blanket patterned above the substrate layer 202. In the illustrated example, to reduce cost, there is no field oxide (FOX) isolation, shallow trench isolation (STI) or deep trench isolation (DTI). In some examples, transition isolation is done through a looped transistor design. For example, the gate oxide layer 206 is formed on the substrate layer 202 in the example shown in FIG. 4 and the polysilicon layer 208 is formed on the gate oxide layer 206, as shown in FIG. 5. To remove portions of the gate oxide layer 206 and the polysilicon layer 208 as shown in the illustrated example of FIG. 5, a portion of the layers 206, 208 is patterned and/or etched away. In the illustrated example of FIG. 6, an in-situ doping and/or implanting process is used to provide the first layer 202 with the conductive doped regions 204 (e.g., a doping of N+ to create a very low resistivity in a range). In the illustrated example, the conductive doped regions 204 provide electrically conductive pathways for electrons to flow between, for example, separate structures of the gate oxide layer 206.

Figure 7:
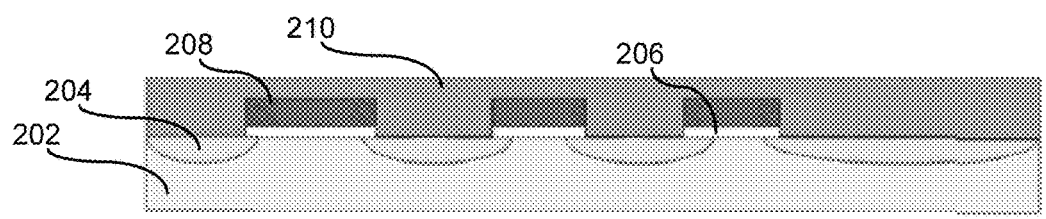
Figure 8:
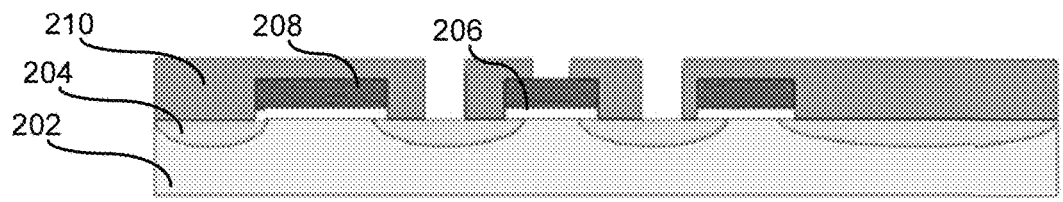

As shown in FIGS. 7 and 8, the example ILD layer 210 is formed or deposited on the substrate layer 202 and the patterned structures of the gate oxide layer 206 and the polysilicon layer 208. In the illustrated example, the ILD layer 210 is contact patterned and/or etched away using, for example, a photo lithography process to form the patterned structures of the ILD layer 210 shown in the illustrated example of FIG. 8.

Figure 9:
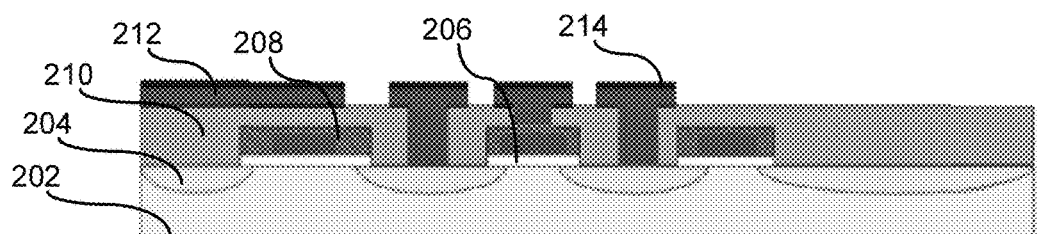

In the illustrated example of FIG. 9, the metal layers 212, 214 are deposited on the ILD layer 210 and the substrate layer 202. In some examples, the metal layer 214 is formed of TiN TaN, NbN, HfN, ZrN, RuO$_2$, IrO$_2$, Al, Ta, Ti, Cu, Co, Ni, Nb, Mo, W, Hf, Zr, Cr, etc. and/or AlCuSi and is used as a bottom electrode for the memristor 215 (FIG. 2). In the illustrated example of FIG. 10, the memristor switching oxide layer 216 is deposited on and/or formed using the metal layer 214. In some examples, the memristor switching oxide layer 216 is TiO$_x$ or TaO$_x$ and has a thickness of between about, for example, a few nanometers to a dozen nanometers. In some examples in which the memristor switching oxide layer 216 is formed using the metal layer 214, the metal layer 214 is oxidized to form the memristor switching oxide layer 216.

Figure 11:
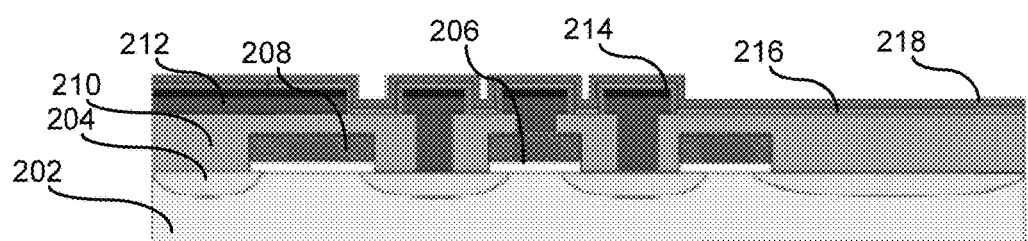

In the illustrated example of FIG. 11, a memristor top electrode 218 is deposited on the memristor switching oxide layer 216. In some examples, the memristor top electrode 218 is formed using Ta and/or TaAl. In the illustrated example of FIG. 12, the memristor switching oxide layer 216 and/or the memristor top electrode layer 218 is patterned and/or etched using a photo lithography process. In the illustrated example of FIG. 13, the dielectric layer 220 is then deposited, patterned and/or etched on the ILD layer 210, the metal layer 212, the metal layer 214 and the memristor top electrode layer 218. In the illustrated example of FIG. 14, the metal layer 222 is formed on the dielectric layer 220, the metal layer 214 and the memristor top electrode layer 218. Also, in the illustrated example of FIG. 14, the thermal inkjet resistor layer 224 is formed on the metal layer 222. In the illustrated example, the thermal inkjet resistor layer is a dual layer including a high sheet resistive layer (e.g., tantalum aluminum (TaAl), TaAlO$_x$, WSiN, TaSiN) and a lower resistive layer (e.g., AlCu). In the illustrated example of FIGS. 14 and 15, the metal layer 222 and the thermal inkjet resistor layer 224 are patterned and/or etched to form bond pad openings. To protect against corrosion, the passivation layer 226 of the illustrated example is formed on the dielectric layer 220, the metal layer 222 and the thermal inkjet resistor layer 224.

Figure 16:
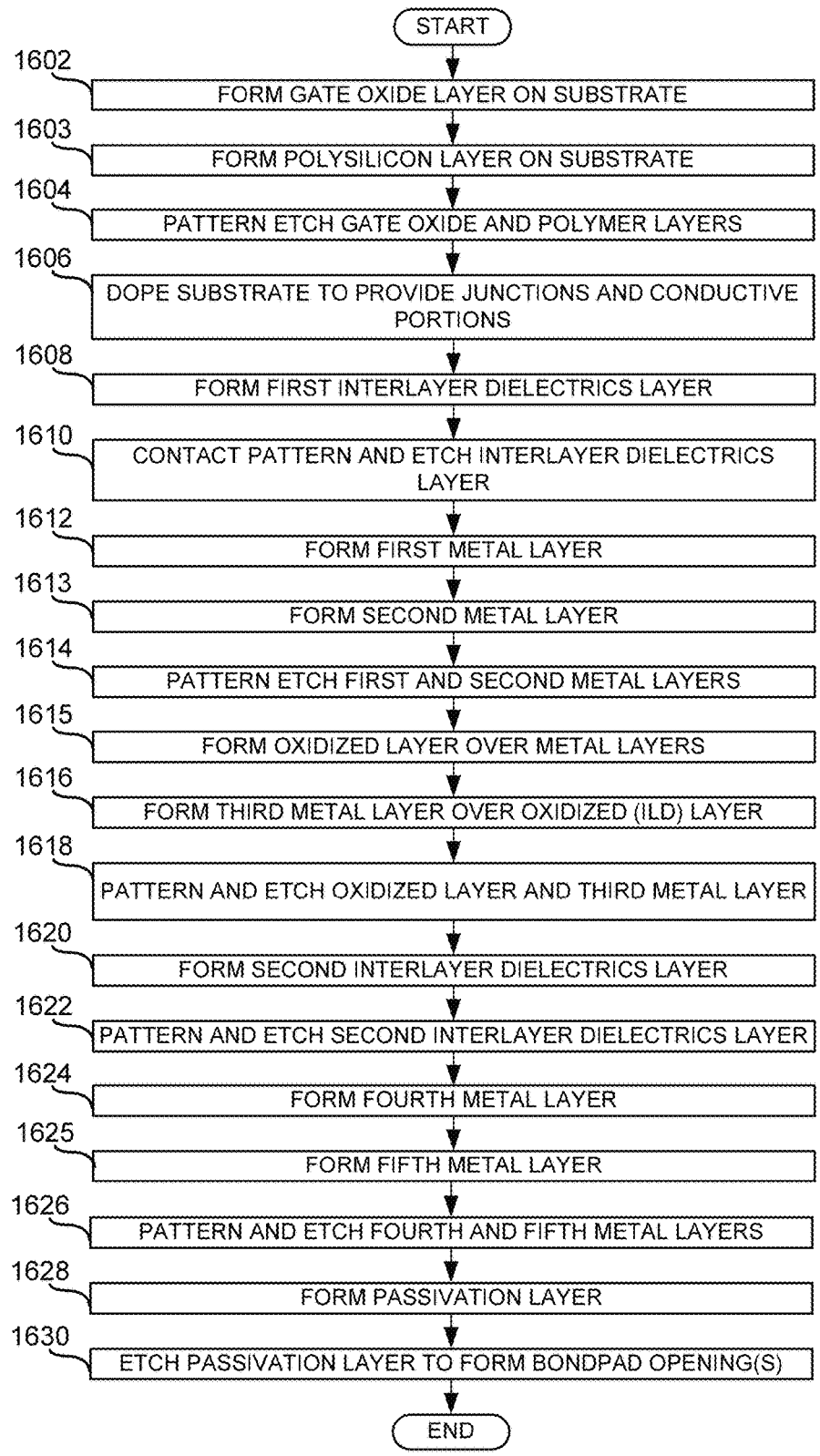
FIG. 16 is an example flowchart representative of machine readable instructions that may be executed to produce the example integrated circuit of FIG. 2.

FIG. 16 illustrates a flowchart representative of example machine readable instructions that may be executed in connection with fabrication lines to produce the integrated circuit 200 of FIG. 2. In this example, the machine readable instructions comprise a production process program for execution by a processor such as the processor 1712 shown in the example processor platform 1702 discussed below in connection with FIG. 17. The production process program may be embodied in software stored on a tangible computer readable storage medium such as a CD-ROM, a floppy disk, a hard drive, a digital versatile disk (DVD), a Blu-ray disk, or a memory associated with the processor 1712, but the entire production process program and/or parts thereof could alternatively be executed by a device other than the processor 1712 and/or embodied in firmware or dedicated hardware. Further, although the example production process is described with reference to the flowchart illustrated in FIG. 16, many other methods of producing the example integrated circuit 200 may alternatively be used. For example, the order of execution of the blocks may be changed, and/or some of the blocks described may be changed, eliminated, or combined.

As mentioned above, the example processes of FIG. 16 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIG. 16 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

Figure 6:
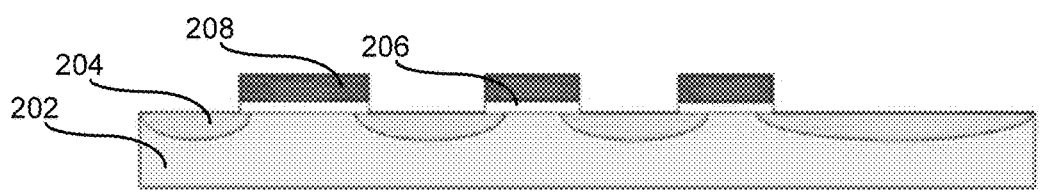

The example process of FIG. 16 is described below in connection with the example structures described above in connection with FIG. 2-15. The example process of FIG. 16 begins by forming the gate oxide layer 206 on the substrate layer 202 (block 1602). The polysilicon layer 208 is then formed on the gate oxide layer 206 (block 1603). At block 1604, the gate oxide layer 206 and the polysilicon layer 208 are patterned and etched to form patterned structures of the gate oxide layer 206 and the polysilicon layer 208, as shown in FIG. 5 (block 1604). At block 1606, the substrate layer 202 undergoes an in-situ doping and/or implanting process to form the conductive and/or doped regions (e.g., N+ doping) 204 in the substrate layer 202, as shown in FIG. 6 (block 1606).

Figure 10:
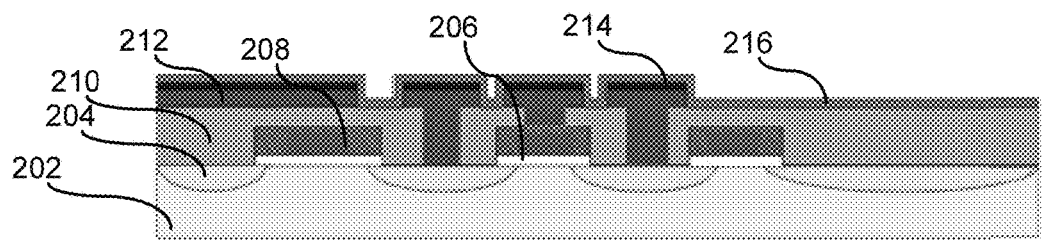

The first ILD layer 210 is then formed or deposited on the doped regions 204 and on the patterned structures formed by the polysilicon layer 208 and/or the gate oxide layer 206, as shown in FIG. 7 (block 1608). The ILD layer 210 is then patterned and/or etched, as shown in FIG. 8 (block 1610). At block 1612, the first metal layer 212 is deposited on the portions of the ILD layer 210 and portions of the doped regions 204 (block 1612). At block 1613, the second metal layer 214 is deposited on the first metal layer 212, as shown in FIG. 9 (block 1613). At block 1614, the first metal layer 212 and the second metal layer 214 are patterned and/or etched to form the etched structures of the first metal layer 212 and the second metal layer 214 as shown in FIG. 9 (block 1614). In some examples, the oxide layer (e.g., memristor switching oxide layer) 216 is formed on portions of the second metal layer 214 and the ILD layer 210, as shown in FIG. 10 (block 1615). For example, the oxide layer 216 may be formed by sputtering on or depositing on the second metal layer 126 and the ILD layer 210. Alternatively, the metal layer 214 and/or 216 may be oxidized.

Figure 12:
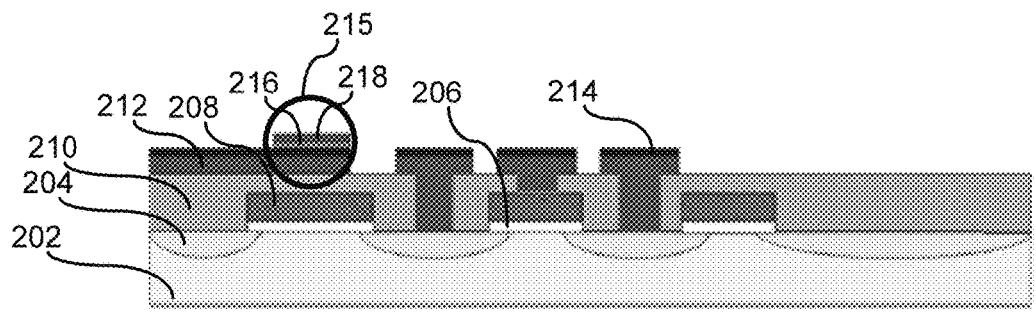
Figure 13:
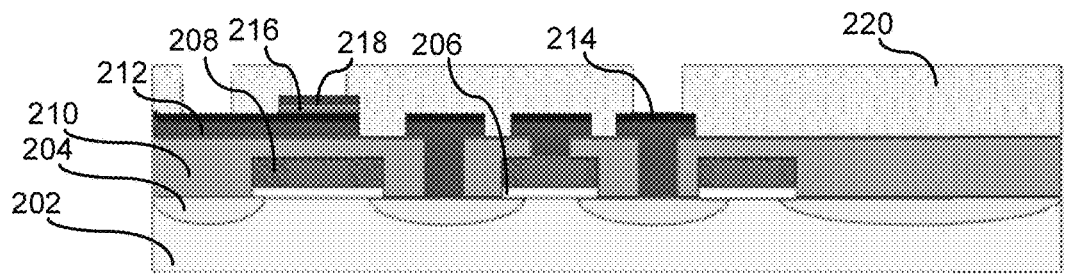

At block 1616, the metal layer (e.g., a top memristor electrode) 218 is formed or deposited on the oxidized layer 216, as shown in FIG. 11 (block 1616). At block 1618, the oxide layer 216 and the third metal layer 218 are patterned and etched as shown in FIG. 12 (block 1618). The second ILD layer 220 is formed or deposited on the first ILD layer 210, the first metal layer 212, the second metal layer 214, the oxide layer 216 and the metal layer 218 (block 1620). The second ILD layer 220 is patterned and etched, as shown in FIG. 13 (block 1622).

Figure 14:
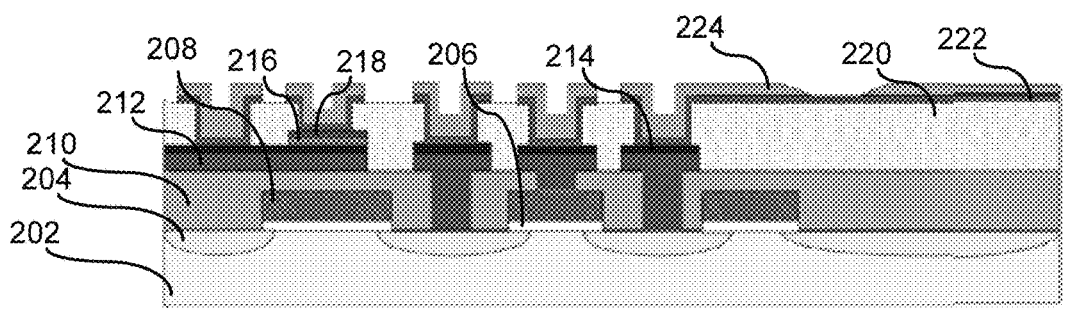
Figure 15:
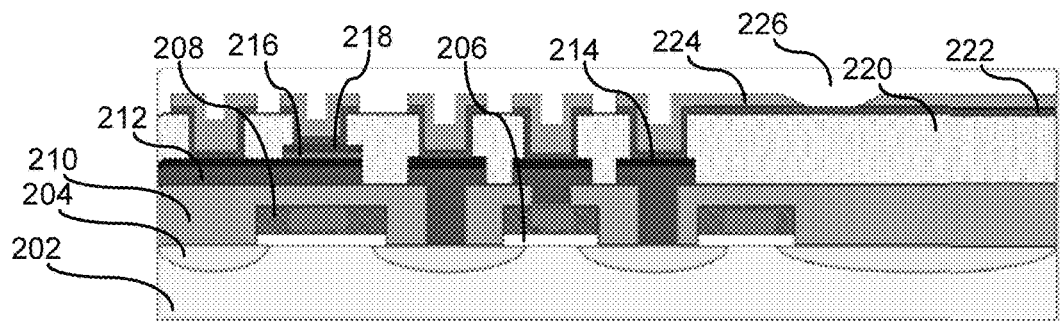

At block 1624, the fourth metal layer 222 is deposited on the ILD layer 220, the metal layer 214 and the metal layer 218 (block 1624). At block 1624, the fifth metal layer 224 is deposited on the fourth metal layer (block 1625). At block 1626, the fourth and fifth metal layers 222, 224 are patterned and etched using a sloped metal etch or dry etch process to define the TIJ resistor, as shown in FIG. 14 (block 1626). To protect against corrosion, the passivation layer 226 is formed or deposited on the second ILD layer 220, the fourth metal layer 222 and the fifth metal layer 224, as shown in FIG. 15 (block 1628). The passivation layer 225 is then patterned and/or etched to form a bondpad opening (block 1630).

Figure 17:
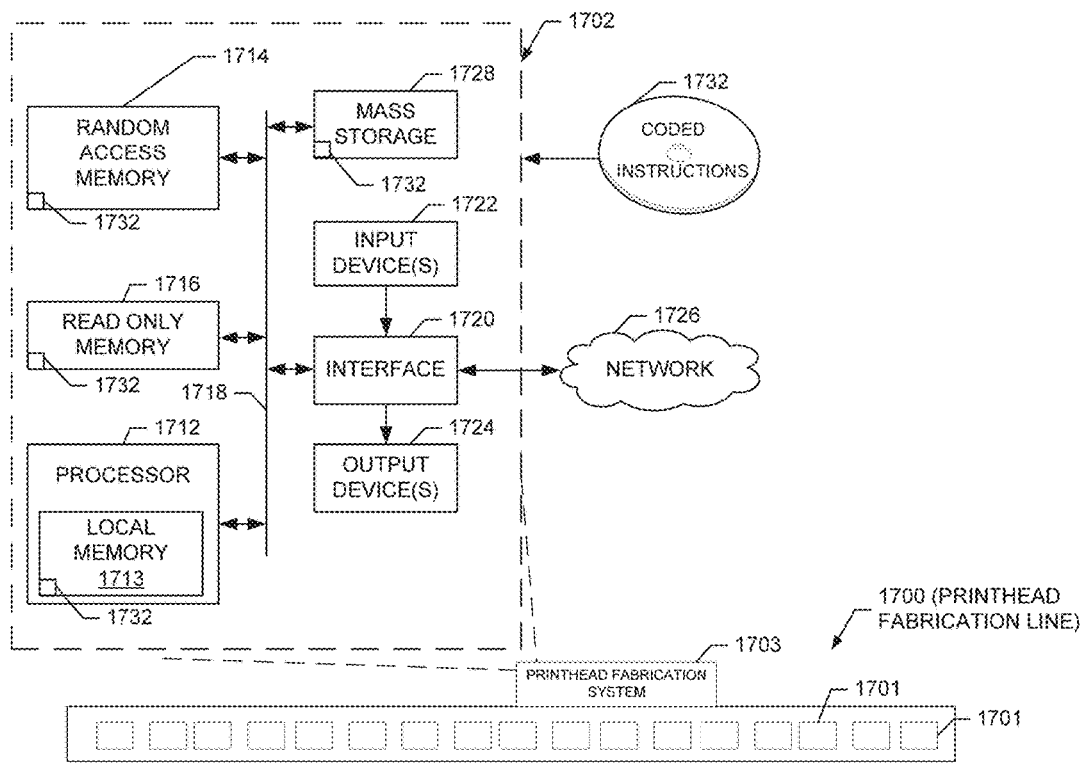
FIG. 17 is a printhead fabrication system including a processor platform to execute the instructions of FIG. 16 to produce the example integrated circuit of FIG. 2.

FIG. 17 is a printhead fabrication line 1700 showing example printheads 1701 being produced thereon. In the illustrated example, the example printheads 1701 include the integrated circuit 200 of FIG. 2. The printhead fabrication line 1700 includes a printhead fabrication system 1703 having a processor 1702 capable of executing the instructions of FIG. 16 to produce the integrated circuit 200 of FIG. 2 and/or any of the example structures disclosed herein. The processor platform 1702 can be, for example, a server, a personal computer or any other type of computing device.

The processor platform 1702 of the illustrated example includes a processor 1712. The processor 1712 of the illustrated example is hardware. For example, the processor 1712 can be implemented by one or more integrated circuits, logic circuits, microprocessors or controllers from any desired family or manufacturer.

The processor 1712 of the illustrated example includes a local memory 1713 (e.g., a cache). The processor 1712 of the illustrated example is in communication with a main memory including a volatile memory 1714 and a non-volatile memory 1716 via a bus 1718. The volatile memory 1714 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1716 may be implemented by flash memory and/or any other desired type of memory device. Access to the main memory 1714, 1716 is controlled by a memory controller.

The processor platform 1702 of the illustrated example also includes an interface circuit 1720. The interface circuit 1720 may be implemented by any type of interface standard, such as an Ethernet interface, a universal serial bus (USB), and/or a PCI express interface.

In the illustrated example, one or more input devices 1722 are connected to the interface circuit 1720. The input device(s) 1722 permit(s) a user to enter data and commands into the processor 1712. The input device(s) can be implemented by, for example, a keyboard, a button, a mouse, a touchscreen, a track-pad and/or a trackball.

One or more output devices 1724 are also connected to the interface circuit 1720 of the illustrated example. The output devices 1724 can be implemented, for example, by display devices (e.g., a light emitting diode (LED), an organic light emitting diode (OLED), a touchscreen, a tactile output device, a printer and/or speakers). The interface circuit 1720 of the illustrated example, thus, typically includes a graphics driver card, a graphics driver chip or a graphics driver processor.

The interface circuit 1720 of the illustrated example also includes a communication device such as a transmitter, a receiver, a transceiver, a modem and/or network interface card to facilitate exchange of data with external machines (e.g., computing devices of any kind) via a network 1726 (e.g., an Ethernet connection, a digital subscriber line (DSL), a telephone line, coaxial cable, a cellular telephone system, etc.).

The processor platform 1702 of the illustrated example also includes one or more mass storage devices 1728 for storing software and/or data. Examples of such mass storage devices 1728 include floppy disk drives, hard drive disks, compact disk drives, Blu-ray disk drives, RAID systems, and digital versatile disk (DVD) drives.

Coded instructions 1732 of FIG. 17 may include the example machine readable instructions represented by the flowchart of FIG. 16. In the illustrated example, the coded instructions 1732 may be stored in the mass storage device 1728, in the volatile memory 1714, in the non-volatile memory 1716, and/or on a removable tangible computer readable storage medium such as a CD or DVD.

From the foregoing, it will be appreciated that above disclosed methods, apparatus and articles of manufacture provide a print head and/or imaging device (e.g., printer, copier, etc.) with a large number of memory bits while using a significantly reduced foot-print and enabling significant cost saving. Additionally or alternatively, examples disclosed herein enable and/or facilitate programing and/or reading of secure data stored on a printhead to substantially prevent counterfeiting and/or assist with anti-counterfeiting technologies. Additionally or alternatively, examples disclosed herein increase the number of memory bits while using a smaller area on the printhead, thereby increasing the security of devices produced in accordance with the disclosed examples. In contrast to some known memories, such as erasable programmable read only memories (EPROM), example memristor memories are advantageously used in examples disclosed herein to form memory on a printhead while using a relatively small amount of space on the print head. Example memristor memories are also used in examples disclosed herein to form memories on printheads while substantially reducing thinfilm damage on the printhead caused by fuse breakdown, reducing costs, etc. relative to known techniques for locating memory devices on printheads. For example, using the example memories disclosed herein as compared to some existing technologies, the number of bits that can be stored in ID lines (e.g., the ID line 120 of FIG. 1A) can be increased by approximately four times (e.g., from 256 bits to 1024 bits) and/or the amount of physical space used by the memories on a printhead may be reduced by approximately 88%.

Illustrated examples disclosed herein describe forming or manufacturing memristors integral to a printhead. In some examples, the memristors may be $TiO_x$-based devices where "x" is a non-stoichiometric compound or $TaO_x$-based device including $TaSiO_x$. In some examples, $TiO_x$-based devices advantageously provide high endurance with non-volatility, fast switching, low-energy operation, multiple-state operation, scalability and/or stackability characters. In some examples, $TaO_x$-based devices advantageously provide endurance and/or non-linearity. In some examples, example printheads disclosed herein include two metal layers being different metal layers and/or stacks where the first metal layer(s) includes AlCuSi and/or a bottom electrode for memristor memory and the second metal layer(s) includes a top electrode for the memristor memory and a thermal inkjet (e.g., a relatively high sheet resistive layer (e.g., TaAl, $TaAlO_x$, or WSiN) and a low sheet resistive layer (e.g., AlCu)).

In some examples, the forming and/or switching voltage for the memristors is less than 5 Volts (V). Often, the voltage available to integrated circuits such as the example integrated circuit 200 (FIG. 2) disclosed herein is up to approximately 15.5V. Thus, there is sufficient voltage to operate the memristors and no negative voltage is necessary for switching off. In addition, some example memristor structures on printheads manufactured using examples disclosed herein may be manufactured at even further significant cost savings based on some memristor implementations needing to be able to withstand only a one-time-programming (OTP) process rather than multiple programming processes. That is, some memristors on printheads may only be programmed once (e.g., to store data in the ID line 120 of FIG. 1A) during initialization and/or in a manufacturing process.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An integrated circuit device comprising:
   a substrate comprising a doped substrate layer;
   a memristor over the substrate and comprising a first metal layer as a first electrode, a second metal layer as a second electrode, and a switching oxide layer between the first and second metal layers;
   a thermal resistor layer over the substrate; and
   a gate oxide layer and a polysilicon layer, the gate oxide layer between the doped substrate layer and the polysilicon layer.

2. The integrated circuit device of claim 1, wherein the doped substrate layer comprises doped regions and a channel between the doped regions under the gate oxide layer.

3. The integrated circuit device of claim 2, further comprising metal contacts formed of a third metal layer and in contact with the doped regions.

4. The integrated circuit device of claim 1, wherein the memristor is above the polysilicon layer.

5. The integrated circuit device of claim 1, further comprising:
   a third metal layer electrically contacted to the thermal resistor layer; and
   a dielectric layer between the doped substrate layer and the third metal layer.

6. The integrated circuit device of claim 1, wherein the thermal resistor layer comprises a first layer comprising a material selected from the group consisting of tantalum aluminum, tantalum aluminum oxide, tungsten silicon nitride, tantalum silicon nitride, and an aluminum copper alloy.

7. The integrated circuit device of claim 6, wherein the thermal resistor layer further comprises a second layer comprising a material having a lower resistivity than the first layer.

8. An integrated circuit device comprising:
   a substrate;
   a memristor over the substrate and comprising a first metal layer as a first electrode, a second metal layer as a second electrode, and a switching oxide layer between the first and second metal layers;
   a thermal resistor layer over the substrate; and
   a glass layer between the substrate and the memristor.

9. The integrated circuit device of claim 8, wherein the thermal resistor layer comprises a first layer comprising a material selected from the group consisting of tantalum aluminum, tantalum aluminum oxide, tungsten silicon nitride, tantalum silicon nitride, and an aluminum copper alloy.

10. The integrated circuit device of claim 9, wherein the thermal resistor layer further comprises a second layer comprising a material having a lower resistivity than the first layer.

11. A method of forming an integrated circuit device, comprising:
   forming a memristor over a substrate comprising a doped substrate layer, the memristor comprising a switching oxide layer on a first metal layer and a second metal layer on the switching oxide layer, wherein the first metal layer comprises a first electrode of the memristor and the second metal layer comprises a second electrode of the memristor;
   forming a thermal resistor layer over the substrate; and
   forming a gate oxide layer and a polysilicon layer over the substrate, the gate oxide layer between the doped substrate layer and the polysilicon layer.

12. The method of claim 11, further comprising forming the switching oxide layer by oxidizing a portion of the first metal layer.

13. The method of claim 11, further comprising forming the switching oxide layer depositing or sputtering the switching oxide layer on the first metal layer.

14. The method of claim 11, further comprising etching the switching oxide layer and the second metal layer.

15. The method of claim 11, further comprising:
   forming doped regions in the substrate, wherein the gate oxide layer above the substrate defines a channel in the substrate between the doped regions.

16. The method of claim 15, further comprising:
   forming a third metal layer to provide electrical contacts to the doped regions; and
   forming the first metal layer over the third metal layer.

17. The method of claim 16, further comprising:
   forming the switching oxide layer over the first metal layer;
   forming the second metal layer over the switching oxide layer; and
   patterning the switching oxide layer and the second metal layer to form the memristor.

18. The method of claim 17, further comprising:
after the patterning, forming a dielectric layer over the memristor; and
forming the thermal resistor layer over the dielectric layer.

* * * * *